United States Patent
Takenaka

(10) Patent No.: US 6,235,629 B1
(45) Date of Patent: May 22, 2001

(54) PROCESS FOR PRODUCING A SEMICONDUCTOR DEVICE

(75) Inventor: Nobuyuki Takenaka, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/382,670

(22) Filed: Aug. 25, 1999

(30) Foreign Application Priority Data

Sep. 29, 1998 (JP) .................................................. 10-274866

(51) Int. Cl.$^7$ ................................................ H01L 21/4763
(52) U.S. Cl. ........................................... 438/638; 438/618
(58) Field of Search .................................... 438/638, 639, 438/637, 640, 618, 633, 634, 700

(56) References Cited

U.S. PATENT DOCUMENTS

| | | | | |
|---|---|---|---|---|
| 3,657,613 | * | 4/1972 | Brody et al. | 317/235 |
| 6,004,883 | * | 12/1999 | Yu et al. | 438/706 |
| 6,037,213 | * | 3/2000 | Shih et al. | 438/638 |
| 6,080,655 | * | 6/2000 | Givens et al. | 438/638 |
| 6,096,655 | * | 8/2000 | Lee et al. | 438/700 |
| 6,100,184 | * | 8/2000 | Zhao et al. | 438/638 |

FOREIGN PATENT DOCUMENTS 7-153757   6/1995   (JP) .
8-17918    1/1996   (JP) .

* cited by examiner

Primary Examiner—Michael Trinh
(74) Attorney, Agent, or Firm—Nixon & Vanderhye P.C.

(57) ABSTRACT

A process for producing a semiconductor device comprising the steps of: forming a first insulating film on an underlayer having an electrically conductive layer; forming a first opening in the first insulating film to expose at least part of the electrically conductive layer; forming on the first insulating film a second insulating film which is more susceptible to etching than the first insulating film while filling the first opening with the second insulating film; forming a mask having an opening at least as large as the first opening in a region on the second insulating film which region corresponds to the first opening; removing at least the second insulating film filling the first opening with use of the mask thereby to form a second opening; depositing a material for forming a wiring layer entirely on a surface so as to fill the first opening and the second opening with the material, thereby to form in the first opening and the second opening a wiring layer which electrically connects to the electrically conductive layer; and removing the material for forming the wiring layer deposited on an upper surface of the second opening and on the second insulating film, by polishing.

14 Claims, 4 Drawing Sheets

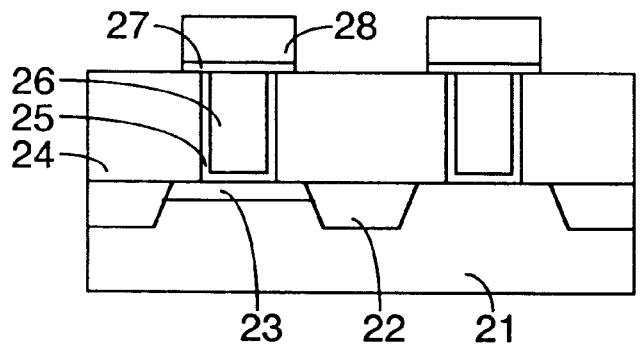
Fig.2 (a) prior art
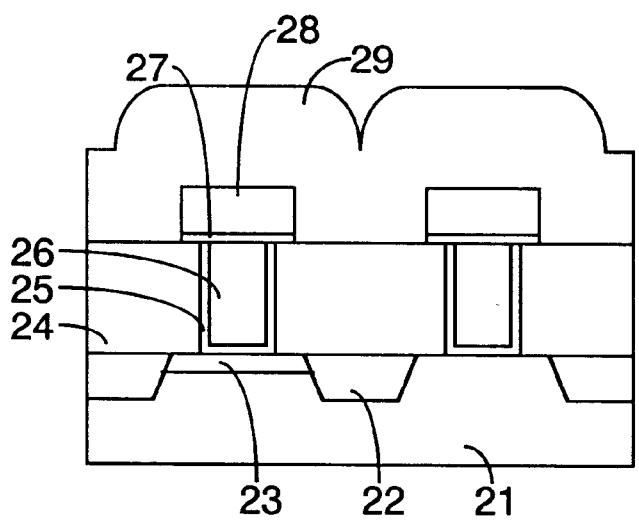
Fig.2 (b) prior art
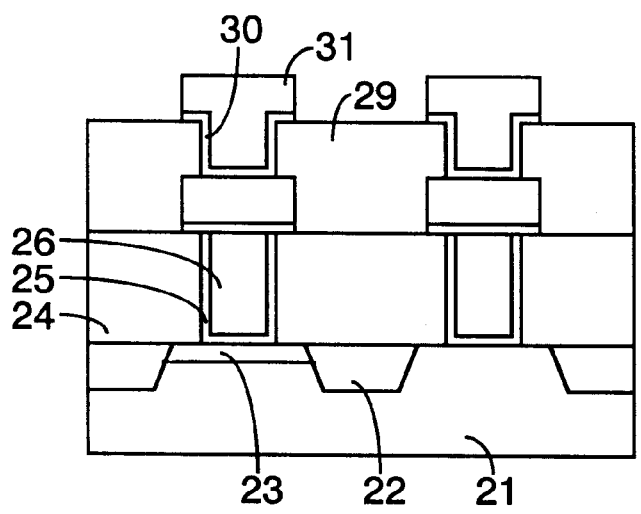
Fig.2 (c) prior art

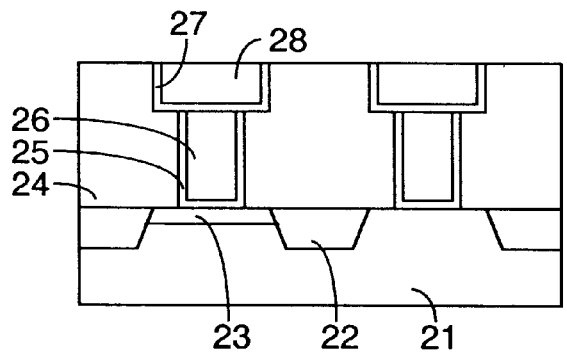
Fig.3 (a) prior art
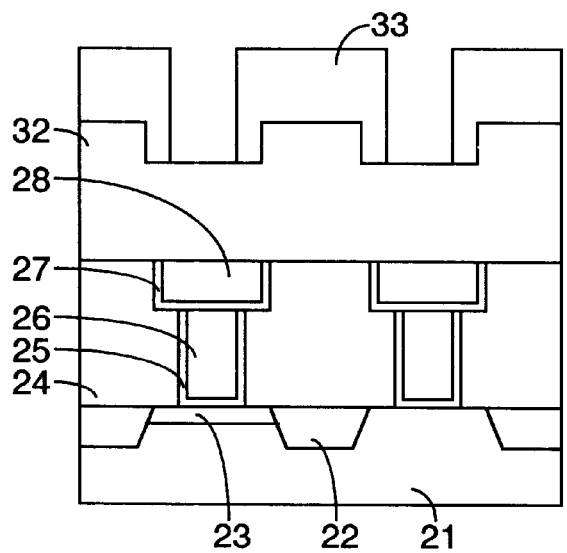
Fig.3 (b) prior art
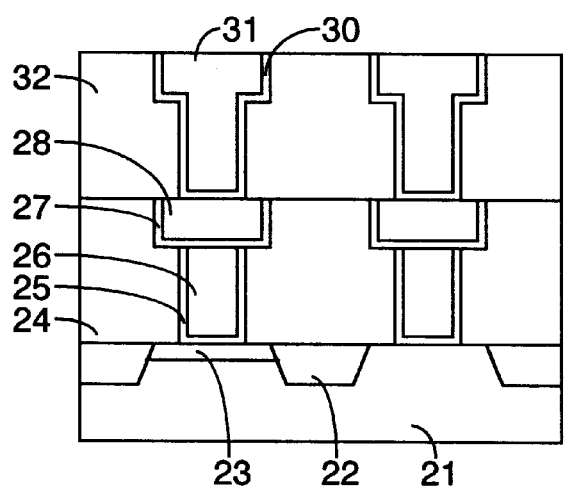
Fig.3 (c) prior art

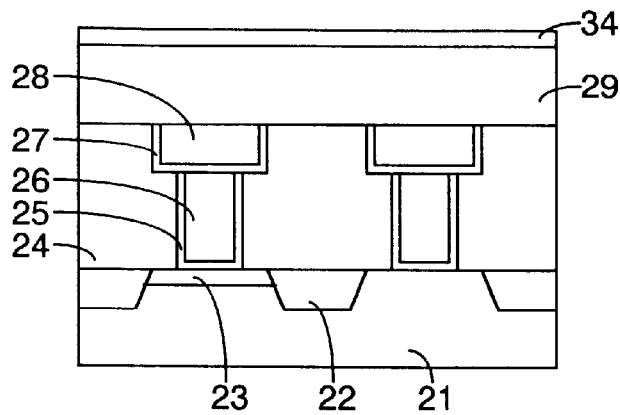
Fig.4 (a) prior art
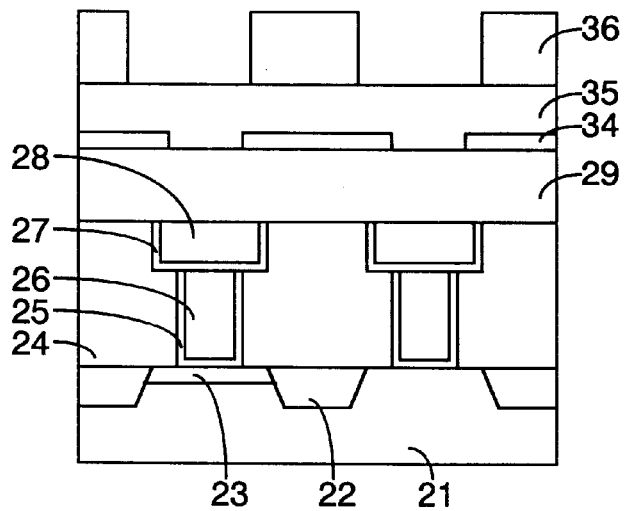
Fig.4 (b) prior art
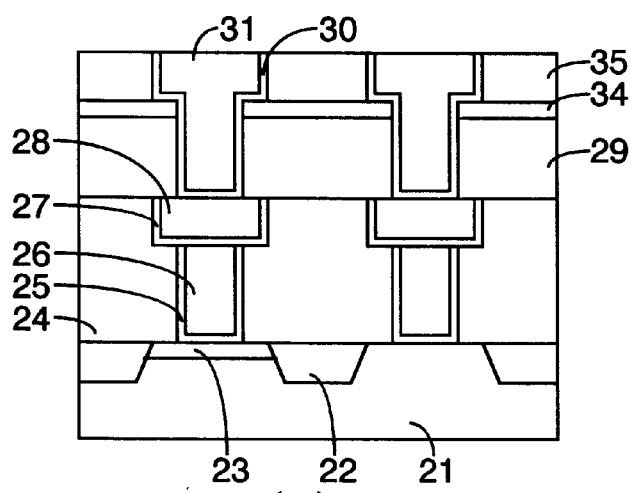
Fig.4 (c) prior art

PROCESS FOR PRODUCING A SEMICONDUCTOR DEVICE

CROSS-REFERENCE TO RELATED APPLICATION

This application is related to Japanese application No. 10(1998)-274866 filed on Sep. 29, 1998, whose priority is claimed under 35 USC §119, the disclosure of which is incorporated by reference in its entirety.

BACKGROUND OF THE INVENTION

1. Field of the Invention

The present invention relates to a process for producing a semiconductor device, particularly a semiconductor device having a plurality of wiring layers.

2. Description of Related Art

A first conventional process for forming a multiple-layered interconnect is shown in FIGS. 2(a) to 2(c). As shown in FIGS. 2(a) and 2(b), an insulating film 29 is formed on a patterned wiring layer 28 formed of an aluminum alloy film on an interlayer dielectric film 24. Thereafter, the insulating film 29 is flattened by a technique such as a chemical mechanical polishing method (hereinafter, referred to as CMP method), and subsequently a through hole is formed. A barrier metal layer 30 and an electrically conductive film 31 which are to form an upper wiring layer are formed on the insulating film 29 and patterned, as shown in FIG. 2(c). By repeating the above-mentioned process, the multiple-layered interconnect structure is formed.

If the aspect ratio of the through hole is high, tungsten is buried in the opening of the through hole by a CVD method and then etched back to form a tungsten plug. Thereafter, the upper wiring layer is formed.

In this process of forming the insulating film 29 after the wiring layer 28 is formed, if a wiring pitch is small, it is difficult to bury the insulating layer 29 between the wiring layers 28. Further, it is difficult to form the upper wiring layer because the resulting surface after the formation of the insulating film 29 is formed is so rough.

For these reasons, Japanese Unexamined Patent Publication No. HEI 7(1995)-153757 proposes a process of forming a through hole and a trench for wiring in the insulating film and subsequently filling them with a material for wiring, as in the following second conventional art.

The second conventional process for forming a multiple-layered interconnect is shown in FIGS. 3(a) to 3(c). As shown in FIG. 3(a), a trench for wiring is formed in an insulating film 32 formed thick on an underlying wiring layer 28. Next, a through hole is formed with use of a through hole pattern mask 33 which is formed on the insulating film 32, as shown in FIG. 3(b). Thereafter a barrier metal layer 30 and an electrically conductive film 31 are formed as materials for wiring in the wiring trench and the through hole, and an unnecessary part of the materials for wiring is removed by a CMP method for flattening. Thus an buried wiring layer is formed, as shown in FIG. 3(c).

In FIGS. 3(a) to 3(c), the through hole is formed after the wiring trench is formed. However, the through hole may be first formed, before the formation of the wiring trench and the subsequent burying of the materials for wiring.

However, in this process of forming the wiring trench and the through hole in the insulating film and afterward burying the wiring materials therein, it is difficult to control the depth of wiring trenches because of variations in etching within a wafer and because of variations in etch depth caused by various widths of wiring trenches. As a result, the depth of the wiring trenches varies greatly. This variation leads directly to variations in the thickness of the wiring layers. consequently, there is a problem that resistance varies greatly among the wiring layers.

As means to solve this problem, Japanese Unexamined Patent Publication No. HEI 8(1996)-17918 proposes a process of providing an etching stop layer in the middle of the insulating film as in the following third conventional art.

The third conventional process for forming a multiple-layered interconnect is shown in FIGS. 4(a) to 4(c). As shown in FIG. 4(a), an insulating film 29 of a $SiO_2$ film and an etching stop layer 34 of a SiN film are formed on an underlying wiring layer 28. Subsequently the etching stop layer 34 is removed from a region where a through hole is to be formed, by etching using a resist film as a mask. After the resist film is removed, an insulating film 35 is formed and a resist layer 36 with a wiring pattern is formed as shown in FIG. 4(b). When the insulating films 35 and 29 are etched using this resist layer 36 as a mask, etching stops at the etching stop layer 34 in a region of a wiring trench and proceeds to the underlying wiring layer 28 in the region of the through hole. Subsequently, the resist layer 36 is removed, and a barrier metal layer 30 and an electrically conductive film 31 are formed as materials for wiring in the wiring trench and the through hole. An unnecessary part of the materials for wiring is removed by a CMP method for flattening. Thus a buried wiring layer is formed as shown in FIG. 4(c). According to this process, the depth of wiring trenches is uniform, and buried wiring layers of uniform resistance can be obtained.

Additionally, in FIGS. 2(a) to 2(c), 3(a) to 3(c) and 4(a) to 4(c), there are also shown a semiconductor substrate 21, a device isolation region 22, a diffusion layer 23, an interlayer dielectric film 24, a barrier metal layer 25, a contact plug 26, a barrier metal layer 27, a wiring layer 28, an insulating film 29, a barrier metal layer 30, an electrically conductive layer 31, an insulating film 32, a through hole pattern mask 33, an etching stop layer 34, an insulating film 35 and a resist layer 36.

The above-described process of providing the etching stop layer in the middle of the insulating film can eliminate variations in the resistance of the wiring layers. However, when the through hole is formed, the upper insulating layer 35 has already been formed. Accordingly, the aspect ratio of the through hole is high, which results in a difficult patterning. Also there is a problem that oxygen generated while the lower insulating film 29 is etched decreases the selective ratio of the insulating layer to the etching stop layer.

Further, as more and more highly semiconductor devices are integrated, the wiring density increases and therefore the capacitance produced between wires rises, which affect fast operation adversely. For this reason, insulating films having low dielectric constants are now being studied instead of conventional insulating films made of oxides. SiOF films which are fluorinated oxide films are known as such insulating films, but the dielectric constants of the films are not sufficiently low. Accordingly, films of carbon-base synthetic resins are being developed instead of silicon-base films recently. Such films, however, are etched at the same time as the resist mask is removed if they are used in the process shown in FIGS. 4(a) to 4(c). As a result, at ashing after the insulating film at the through hole region is etched, the synthetic resin films in the wiring trench region are greatly etched in a lateral direction. For this reason, the combination of the process of FIGS. 4(a) to 4(c) and a synthetic resin film has not been suitable for high integration.

SUMMARY OF THE INVENTION

The present invention provides a process for producing a semiconductor device comprising the steps of forming a first insulating film on an underlayer having an electrically conductive layer; forming a first opening in the first insulating film to expose at least a part of the electrically conductive layer; forming on the first insulating film a second insulating film which is more susceptible to etching than the first insulating film while filling the first opening with the second insulating film; forming a mask having an opening at least as large as the first opening in a region on the second insulating film which region corresponds to the first opening; removing at least the second insulating film filling the first opening with use of the mask thereby to form a second opening; depositing a material for forming a wiring layer entirely on a surface so as to fill the first opening and the second opening with the material, thereby to form in the first opening and the second opening a wiring layer which electrically connects to the electrically conductive layer; and removing the material for forming the wiring layer deposited on the upper surface of the second opening and on the second insulating film, by polishing.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 2(a) to 2(c) are schematic sectional views illustrating a first conventional process for producing a semiconductor device having a multiple-layered interconnect;

FIGS. 3(a) to 3(c) are schematic sectional views illustrating a second conventional process for producing a semiconductor device having a multiple-layered interconnect;

FIGS. 4(a) to 4(c) are schematic sectional views illustrating a third conventional process for producing a semiconductor device having a multiple-layered interconnect.

DESCRIPTION OF THE PREFERRED EMBODIMENTS

Figure 1:
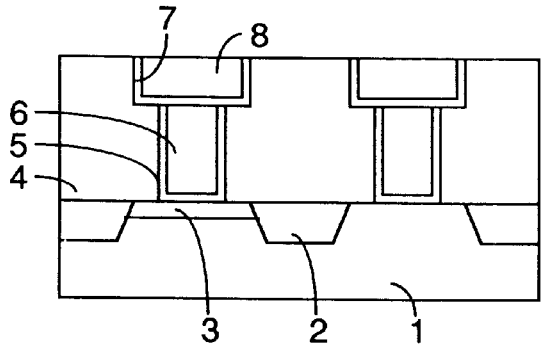
FIGS. 1(a) to 1(f) are schematic sectional views illustrating a process for producing a semiconductor device in accordance with an example of the present invention.
Figure 1:
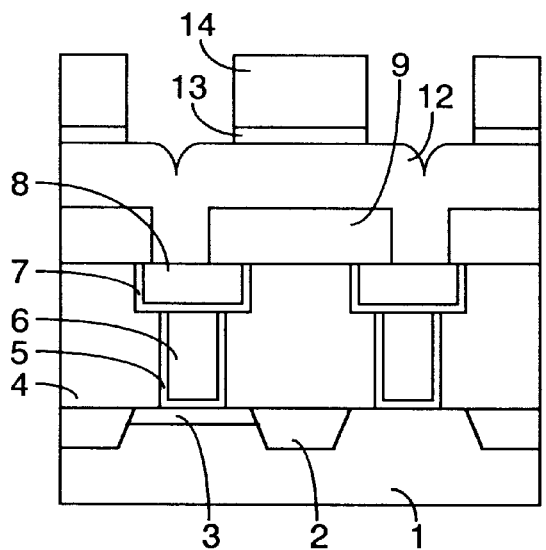
Figure 1:
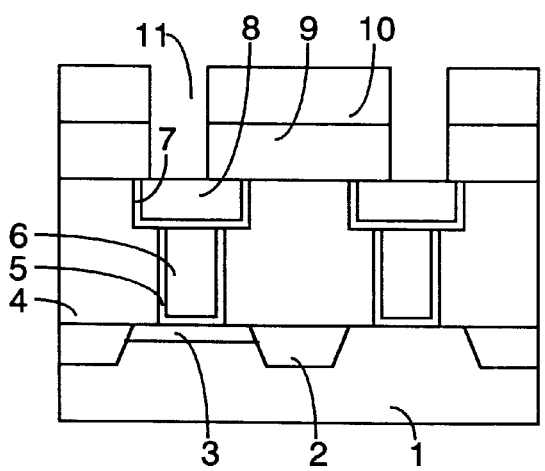
Figure 1:
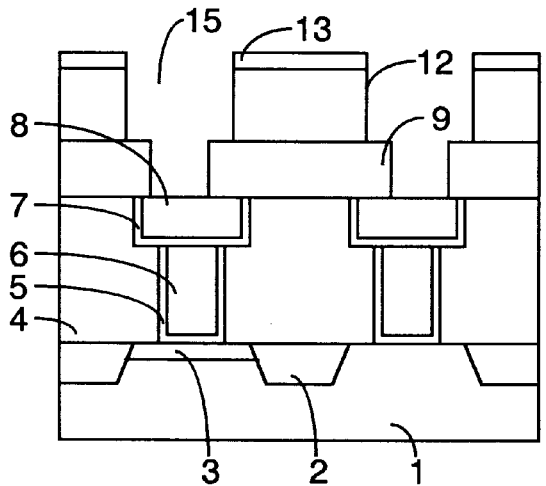
Figure 1:
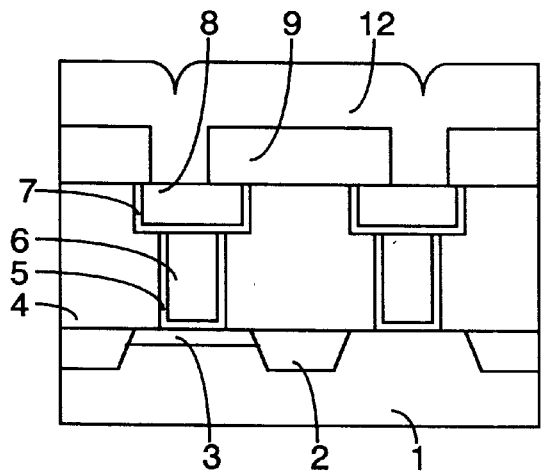
Figure 1:
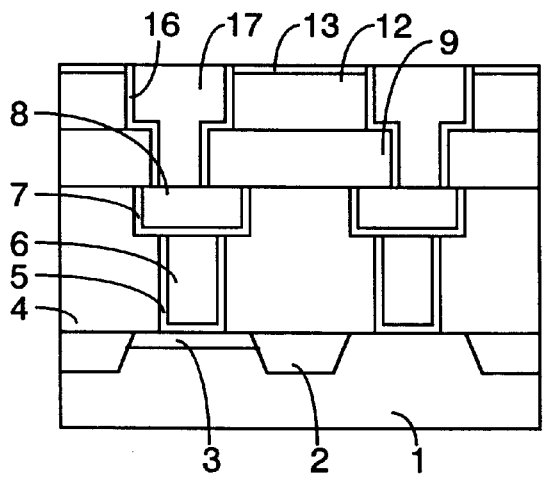

The present invention is now described step by step.

First, a first insulating film is formed on an underlayer including an electrically conductive layer. The conductive layer here is not particularly limited provided that the layer is required to have an electrical connection with an upper wiring layer. For example, the conductive layer may be a wiring layer formed in an interlayer dielectric film, a gate electrode, a source/drain region and the like. Examples of the underlayer may be a semiconductor substrate, an interlayer dielectric film and the like.

A material of the first insulating film is not particularly limited provided that it is made of a material which is less susceptible than a second insulating film which is described below. For example, a material of the first insulating film may be formed of a silicon oxide film, a silicon nitride film, a laminate of both and the like. The thickness of the first insulating film varies depending upon the kind of a material composing the film, but in general, may preferably be 100 to 1500 nm. The thickness may be changed partially to reduce difference in level which may exist on the surface of the underlayer.

The first insulating film may be formed by a CVD method, a plasma CVD method, a sputtering method or the like if a silicon-base material is used for the film.

Next, a first opening is formed to expose at least a part of the conductive layer. A plan view shape of the first opening is not particularly limited and may be rectangular, square, circular, ellipsoidal or the like. The first opening may preferably have a width of 50 to 500 nm in a section perpendicular to the longitudinal direction of a wiring layer which is described below.

A method for forming the first opening is not particularly limited and is usable for any known method. For example, a resist layer is formed on the first insulating film and an opening having the same shape as the first opening is formed in this resist layer. The first insulating film is etched using the resist layer as a mask, thereby to form the first opening having a predetermined shape. Etching at this time may be either isotropic or anisotropic, but preferred is an anisotropic etching such as a dry etching using a high-density plasma source which allows etching in finer width.

Next, the second insulating film more susceptible to etching than the first insulating film is formed on the first insulating film, thereby filling the first opening.

A material of the second insulating film is not particularly limited provided that it is formed of a material more likely to be etched than the first insulating film. Also the second insulating film may preferably be formed of a material having a dielectric constant of 1.5 to 3.0. For example, films of a fluorinated amorphous carbon, a polytetrafluorooxyp-xylene, a polyarylene ether and the like may be mentioned. These films for the second dielectric film have a lower dielectric constant than a film of silicon oxide. Therefore, the width of the insulating film between wiring layers may be reduced, and as a result, the invention has the effect of realizing a high-density wiring. The second insulating film may preferably have an enough thickness to fill at least the first opening. More particularly, the second insulating film can usually fill the first opening by being formed to a thickness of 100 to 1500 nm from the upper surface of the first insulating film.

The second insulating film may be formed using any known method that is suitable for a material to be used. For example, the fluorinated amorphous carbon film may be formed by a plasma CVD method using a hydrocarbon gas containing fluorine. In the case of a polymeric film such as a polytetrafluorooxy-p-xylene film or a polyarylene ether film, the second insulating film may be formed by vaporizing a monomer for producing the polymer and depositing the monomer on the first insulating film and at the same time polymerizing the monomer, or by applying a solution of such a monomer onto the first insulating film, for example, by a spin coating method and polymerizing the monomer with heat (i.e., spin-on polymerization).

Subsequently, a mask is formed which has an opening at least as large as the first opening, the opening being located in a region on the second insulating film which corresponds to the first opening. Here, the mask is preferably formed of a material less susceptible to etching than the second insulating film. For example, organic films such as a resist film and inorganic films such as a silicon oxide film, a silicon nitride film, a silicon nitric oxide film and a laminate thereof may be mentioned. Among these films, the inorganic films are preferred because they can also be utilized as stoppers to prevent the second insulating film from being polished in a later polishing step.

The shape of the opening formed in the mask is not particularly limited provided that the opening has at least the same size as that of the first opening, but preferably it is larger than the first opening. Further it is preferable that the opening of the mask has a shape corresponding to the shape of a desired wiring layer.

Next, using the above-described mask, at least the second insulating film filling the first opening is removed, and thereby a second opening is formed. Since the first insulating film is made of a material less susceptible to etching than the second insulating film, only the second insulating film can be selectively removed even though a stopper layer is not provided as in the conventional process. This removal may be achieved by an isotropic and an anisotropic etching method, among which preferred is the anisotropic etching such as a dry etching using a high-density plasma source which allows a fine etching.

Subsequently, a material for forming the wiring layer is deposited on the entire face so as to bury the first and second openings, thereby to form the wiring layer which electrically connects the conductive layer, in the first and second openings.

As the material for the wiring layer, any known material such as a metal (e.g., Al, Au, Ag, Cu) or an alloy of such a metal may be used. Further, a barrier metal layer may be formed on sidewalls of the first and second openings in order to prevent the metal composing the wiring layer from diffusing into adjacent components. The barrier metal layer may be formed of a metal nitride such as TiN, TaN or WNx, or a laminate such as TiN/Ti or Ta/TaN.

The wiring layer may be formed by a sputtering method, a vapor deposition method or the like.

In addition, the material for forming the wiring layer also deposits on the upper surface of the second opening and on the second insulating film at the above formation of the wiring layer. By removing this excess material for forming the wiring layer by a polishing method, a semiconductor device having a flat upper surface can be produced.

As the polishing method, a chemical mechanical polishing (CMP) method is usually used. In the case where the inorganic film has been used as the mask on the second insulating film, the inorganic film serves as a stopper at this time and the second insulating film can be prevented from being polished during the above polishing process.

EXAMPLES

The present invention is now described in detail by way of examples.

Example 1

In this example, description is started from a state in which underlying wiring layers 5 to 8 have already been formed, with reference to FIGS. 1(*a*) to 1(*f*). In the figures, there are shown a semiconductor substrate 1, a device isolation region 2, a diffusion layer 3, an interlayer dielectric film 4, a barrier metal layer 5, a contact plug 6, a barrier metal layer 7, an electrically conductive film 8, a plasma oxidized film 9, a resist layer 10, a through hole 11, a film with a low dielectric constant 12, a P-SiN film 13, a resist layer 14, a trench for wiring 15, a barrier metal layer 16 and an electrically conductive layer 17.

The contact plug 6 was formed in the interlayer dielectric film 4 on the semiconductor substrate 1 which had the diffusion layer 3 formed therein, and on the contact plug 6, a wiring layer was formed of the barrier metal layer 7 and the conductive film 8 (see FIG. 1(*a*)). On this wiring layer, a first insulating film, for example, the plasma oxidized film 9, was formed to a thickness of 600 nm. The plasma oxidized film 9 was a silicon oxide film formed by a plasma CVD method, and was formed to the predetermined thickness by controlling deposition time under the conditions of a pressure of 8 Torr, a deposition temperature of 400° C., an RF power of 700W and a gas flow rate of $TEOS/O_2=800/600$ sccm.

Subsequently, a through-hole pattern was formed of the resist layer 10 on the plasma oxidized film 9, and thereafter, the through hole 11 was formed in the plasma oxidized film 9 by dry etching using the resist layer 10 as a mask. The dry etching was carried out using a dry etching apparatus including a high-density plasma source of an inductivity-coupled type under a pressure of 10 mTorr at a source power of 800 W and a gas flow rate of $C_4F_8/Ar=15/100$ sccm, with 20% over-etching after the underlying wiring layer was exposed (see FIG. 1(*b*)).

Subsequently, the resist layer 10 was removed by an oxygen plasma ashing, and then, an insulating film of fluorinated amorphous carbon (a- C:F) as a second insulating film was formed to a thickness of 500 nm by a parallel plate plasma CVD method. This film was formed to the predetermined thickness by controlling the deposition time under the conditions of a pressure of 1.2 Torr, an applied voltage of 0.59 W/cm$^2$, a deposition temperature of 400° C. and a gas flow rate of $C_2H_2/C_4F_8=10/70$ sccm (see FIG. 1(*c*)).

Next, the P-SiN film 13 which was a silicon nitride film was formed to a thickness of 30 nm on the low dielectric constant film 12 by a plasma CVD method. Deposition conditions were set to a pressure of 5.5 Torr, a deposition temperature of 360° C., an RF power of 410 W and a gas flow rate of $SiN_4/NH_3/N_2=135/50/1400$ sccm. On this film, the resist layer 14 was formed by coating and a trench pattern was formed therein. The trench pattern was transferred to the P-SiN film 13 by dry etching using the resist layer 14 as a mask. The dry etching was performed by a magnetron RIE method under an pressure of 50 mTorr at an RF power of 400 W and a gas flow rate of $CF_4/CHF_3/Ar/O_2=15/5/100/5$ sccm, with a 10% over-etching of the low dielectric constant film 12 (see FIG. 1(*d*)).

Subsequently, the low dielectric constant film 12 was patterned using the P-SiN film 13 as a mask under a pressure of 5 mTorr at an RF power of 1,000 W and a gas flow rate of $O_2=15$ sccm, thereby to form the trench for wiring 15. This patterning was performed under such conditions that the low dielectric constant film 12 in the through hole was also removed. Since the fluorinated amorphous carbon insulating film as the low dielectric constant film 12 was able to provide a sufficient selective ratio of 100 or more with respect to the plasma oxidized film 9 as the first insulating film, the first insulating film was able to maintain its initial shape with little loss. At this time, the resist layer 14 having been used for patterning the P-SiN film 13 was etched and removed simultaneously. Thus the trench for wiring 15 was formed in the low dielectric constant film 12 of fluorinated amorphous carbon (see FIG. 1(*e*)).

Subsequently, by a sputtering method, the barrier metal layer 16 of TiN/Ti=50/30 nm was deposited in the through hole 11 and the trench for wiring 15, and the conductive film 17 of Cu=500 nm having a high electric conductivity was deposited on the barrier metal layer 16. Thereafter, an excess of the barrier metal layer 16 and the conductive film 17 deposited on the P-SiN film 13 was removed by a CMP method. The polishing was performed using an acid-base slurry containing particles of aluminum oxide at a polishing pressure of 7 psi at rotation numbers of 30 rmp and 40 rmp for a polishing cloth and a wafer, respectively, until the P-SiN film was exposed.

Thus, a buried wiring layer was formed which was comprised of the conductive film buried in the through hole and the trench for wiring in the first insulating film 9 and the second insulating film 12, respectively (see FIG. 1(f)).

A required number of wiring layers were formed by repeating the above-described process, through not shown. It is noted that, since the fluorinated amorphous carbon as the low dielectric constant film 12 had a lower dielectric constant (a dielectric constant of about 2.3) than an oxide film (a dielectric constant of about 4), the use thereof decreased capacitance between wiring layers. Therefore, the produced semiconductor device was able to operate at a high speed with a low power. In addition to that, the P-SiN film which was used as an mask in etching the resin film with a low dielectric constant and which was serving as the second insulating film was utilized as a stopper in the CMP of the wiring materials.

Example 2

A buried wiring layer was formed in substantially the same manner as in Example 1 except that, in place of the insulating film of fluorinated amorphous carbon, used was a PALYLEN AF4 (polytetrafluoro-p-xylenes) (a dielectric constant of about 2.5) which was formed by subliming a dimer of a tetrafluoro-p-xylene at 100° C., decomposing it at 650° C. to obtain a gaseous monomer and introducing the obtained monomer to a cooled substrate.

Example 3

A buried wiring layer was formed in substantially the same manner as in Example 1 except that, in place of the insulating film of fluorinated amorphous carbon, used was a PAE (polyarylene ethers) (a dielectric constant of about 2.5) which was formed by a spin-on polymerization method wherein a solution of a polymer in a solvent was applied onto a substrate and the resulting substrate was baked.

As described above in detail, the use of the present invention realizes an easy patterning because the etching for opening the through hole can be carried out in a state where the aspect ratio is low. Also, the depth of the through hole and the thickness of the wiring layer can be controlled by controlling how thick the relating films are formed as in the conventional method. Therefore, variations in the thickness of the wiring layer can be reduced and the wiring layer can be formed to have a uniform thickness.

The etching mask used for patterning the low dielectric constant film which mask is made of a resist film difficult to be patterned, can be utilized as a stopper at the CMP of the material for the buried wiring layer. Therefore, it is unnecessary to form a stopper layer by an additional process.

Thus, it has become possible to obtain a high-quality semiconductor device because the second insulating film is formed of a film having a high selective ratio and a low dielectric constant.

What is claimed is:

1. A process for producing a semiconductor device comprising the steps of:
   forming a first insulating film on an underlayer having an electrically conductive layer;
   forming a first opening in the first insulating film to expose at least part of the electrically conductive layer;
   forming on the first insulating film a second insulating film which is more susceptible to etching than the first insulating film while filling the first opening with the second insulating film;
   forming a mask having an opening at least as large as the first opening in a region on the second insulating film which region corresponds to the first opening;
   removing at least the second insulating film filling the first opening with use of the mask thereby to form a second opening;
   depositing a material for forming a wiring layer entirely on a surface so as to fill the first opening and the second opening with the material, thereby to form in the first opening and the second opening a wiring layer which electrically connects to the electrically conductive layer; and
   removing the material for forming the wiring layer deposited on an upper surface of the second opening and on the second insulating film, by polishing.

2. A process according to claim 1, wherein the second insulating film has a smaller dielectric constant than the first insulating film.

3. A process according to claim 1, wherein the first insulating film is formed of a silicon oxide.

4. A process according to claim 1, wherein the second insulating film is formed of a fluorinated amorphous carbon, a polytetrafluorooxy-p-xylene or a polyarylene ether.

5. A process according to claim 1, wherein the mask is formed of a silicon nitride, silicon nitric oxide or silicon oxide.

6. A process according to claim 1, wherein the first insulating film is formed of a silicon oxide and the second insulating film is formed of a fluorinated amorphous carbon, polytetrafluorooxy-p-xylene or polyarylene ether, and the mask is formed of a silicon nitride, silicon nitric oxide or silicon oxide.

7. A process according to claim 1, wherein the electrically conductive layer is a wiring layer, a gate electrode or a source/drain region formed in an interlayer dielectric film.

8. A process according to claim 1, wherein the first opening has a width of 50 to 500 nm in a section perpendicular to a longitudinal direction of the wiring layer.

9. A process according to claim 1, wherein the second opening has a width of 50 to 1000 nm in a section perpendicular to a longitudinal direction of the wiring layer.

10. A process according to claim 1, wherein the first opening has a height of 100 to 1500 nm.

11. A process according to claim 1, wherein the second opening has a height of 100 to 1500 nm.

12. A process according to claim 1, wherein the polishing is a chemical mechanical polishing.

13. A process according to claim 1, wherein the first opening and the second opening are formed by anisotropic etching.

14. A process according to claim 1, wherein the second insulating film has a thickness of 100 to 1000 nm.

* * * * *